US012543332B2

(12) United States Patent
Maeda et al.

(10) Patent No.: US 12,543,332 B2
(45) Date of Patent: Feb. 3, 2026

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Kazushi Maeda, Tatsuno Hyogo (JP); Ryohei Gejo, Kawasaki Kanagawa (JP); Shigeaki Hayase, Himeji Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 372 days.

(21) Appl. No.: 18/230,144

(22) Filed: Aug. 3, 2023

(65) Prior Publication Data

US 2024/0290874 A1    Aug. 29, 2024

(30) Foreign Application Priority Data

Feb. 27, 2023   (JP) .................................. 2023-028445

(51) Int. Cl.
*H01L 29/739*   (2006.01)
*H10D 12/00*    (2025.01)
(Continued)

(52) U.S. Cl.
CPC ......... *H10D 12/421* (2025.01); *H10D 12/441* (2025.01); *H10D 62/104* (2025.01);
(Continued)

(58) Field of Classification Search
CPC .. H10D 12/421; H10D 12/441; H10D 62/104; H10D 62/106; H10D 62/393;
(Continued)

(56) References Cited

U.S. PATENT DOCUMENTS 9,401,314 B2    7/2016   Otsuki et al.
2017/0154955 A1  6/2017   Harada et al.
(Continued)

FOREIGN PATENT DOCUMENTS

JP        5921784 B2      5/2016
JP     2017-017145 A     1/2017
(Continued)

*Primary Examiner* — Mohammed R Alam
(74) *Attorney, Agent, or Firm* — Knobbe, Martens, Olson & Bear, LLP

(57) ABSTRACT

A semiconductor device includes a semiconductor layer including an element region, and a termination region; a first electrode; a second electrode; a semi-insulating film located on the termination region; an insulating film located between the semiconductor layer and the semi-insulating film; and a protective film located on the semi-insulating film. The insulating film includes an inner perimeter portion, the inner perimeter portion being located between an end portion of the first electrode positioned at the termination region side and an end portion of the second semiconductor part positioned at the termination region side, an outer perimeter portion located between the second electrode and the semiconductor layer, and an intermediate portion located between the inner perimeter portion and the outer perimeter portion. A thickness of the intermediate portion is less than a thickness of the inner perimeter portion and a thickness of the outer perimeter portion.

20 Claims, 2 Drawing Sheets

(51) Int. Cl.
  *H10D 62/10* (2025.01)
  *H10D 62/17* (2025.01)
  *H10D 62/85* (2025.01)

(52) U.S. Cl.
  CPC ......... *H10D 62/106* (2025.01); *H10D 62/393* (2025.01); *H10D 62/8503* (2025.01)

(58) Field of Classification Search
  CPC .. H10D 62/8503; H10D 12/481; H10D 62/10; H10D 62/105; H10D 62/112; H10D 64/112; H10D 62/124; H01L 23/58
  See application file for complete search history.

(56) References Cited

U.S. PATENT DOCUMENTS

| | | | |
|---|---|---|---|
| 2020/0058506 A1* | 2/2020 | Nakamura | ........ H01L 21/26506 |
| 2022/0130951 A1 | 4/2022 | Haraguchi et al. | |

FOREIGN PATENT DOCUMENTS

| | | | |
|---|---|---|---|
| JP | 6079456 B2 | 2/2017 |
| JP | 6519455 B2 | 5/2019 |
| JP | 2022-068558 A | 5/2022 |

* cited by examiner

SEMICONDUCTOR DEVICE

CROSS-REFERENCE TO RELATED APPLICATION

This application is based upon and claims the benefit of priority from Japanese Patent Application No. 2023-028445, filed on Feb. 27, 2023; the entire contents of which are incorporated herein by reference.

FIELD

Embodiments described herein relate generally to a semiconductor device.

BACKGROUND

A configuration in which a semi-insulating film is located in a termination region has been proposed for a semiconductor device used in, for example, power control.

DETAILED DESCRIPTION

Figure 1:
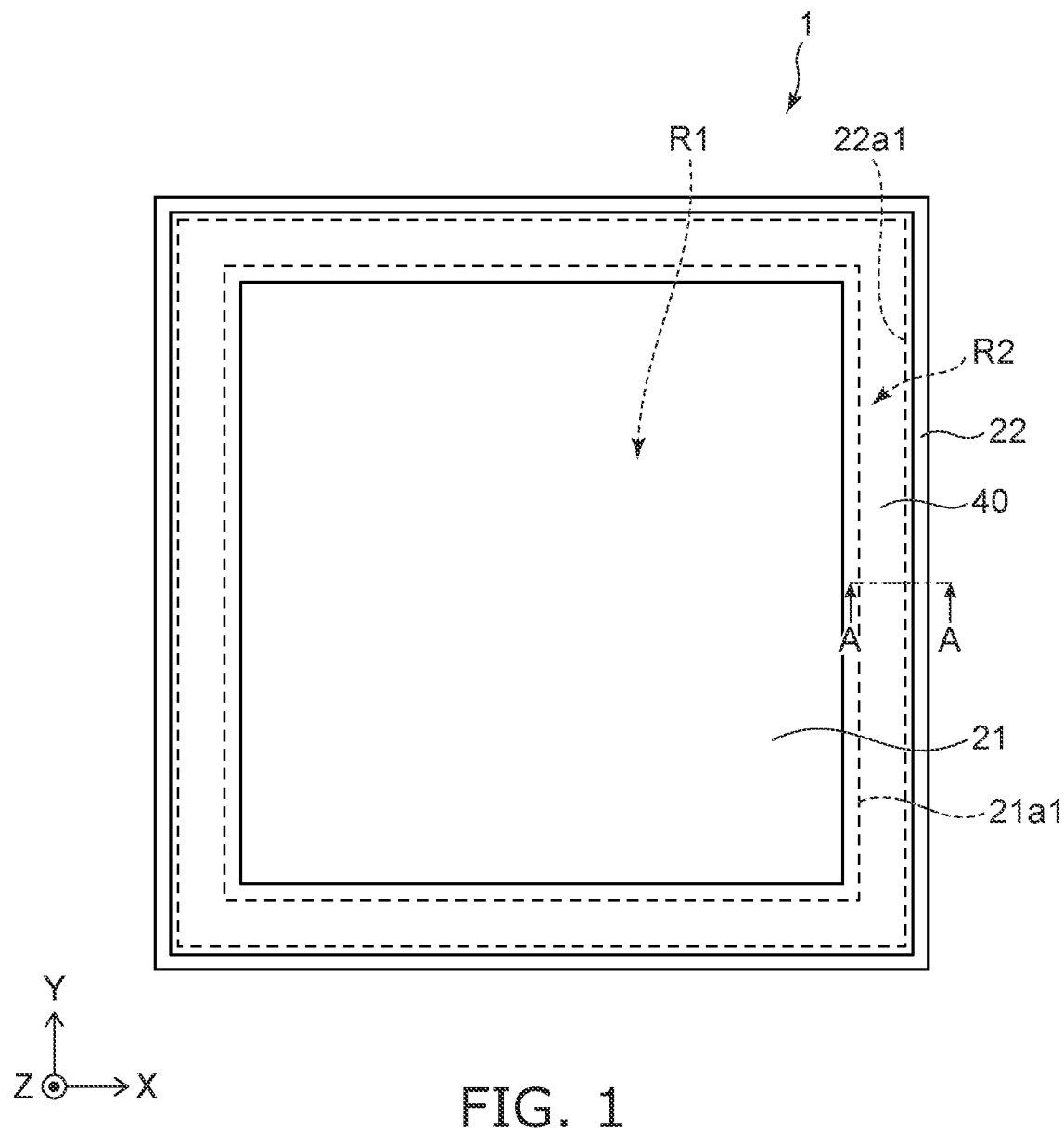
FIG. 1 is a schematic plan view of a semiconductor device of an embodiment.

According to one embodiment, a semiconductor device includes a semiconductor layer including an element region, and a termination region surrounding the element region, the semiconductor layer including a first semiconductor part of a first conductivity type, a second semiconductor part positioned on the first semiconductor part in the element region, the second semiconductor part being of a second conductivity type, and a third semiconductor part positioned on the first semiconductor part in the termination region, the third semiconductor part being of the first conductivity type and having a higher impurity concentration than the first semiconductor part; a first electrode located on the second semiconductor part, the first electrode being electrically connected with the second semiconductor part; a second electrode located on the third semiconductor part, the second electrode being electrically connected with the third semiconductor part; a semi-insulating film located on the termination region of the semiconductor layer, the semi-insulating film contacting the first and second electrodes; an insulating film located between the semiconductor layer and the semi-insulating film; and a protective film located on the semi-insulating film, the protective film being insulative, the insulating film including an inner perimeter portion, the inner perimeter portion being located between an end portion of the first electrode positioned at the termination region side and an end portion of the second semiconductor part positioned at the termination region side, an outer perimeter portion located between the second electrode and the semi-conductor layer, and an intermediate portion located between the inner perimeter portion and the outer perimeter portion, a thickness of the intermediate portion being less than a thickness of the inner perimeter portion and a thickness of the outer perimeter portion.

Exemplary embodiments will now be described with reference to the drawings. Similar components in the drawings are marked with like reference numerals. Although a first conductivity type is described as an n-type and a second conductivity type is described as a p-type in embodiments described below, the first conductivity type may be the p-type, and the second conductivity type may be the n-type.

Figure 2:
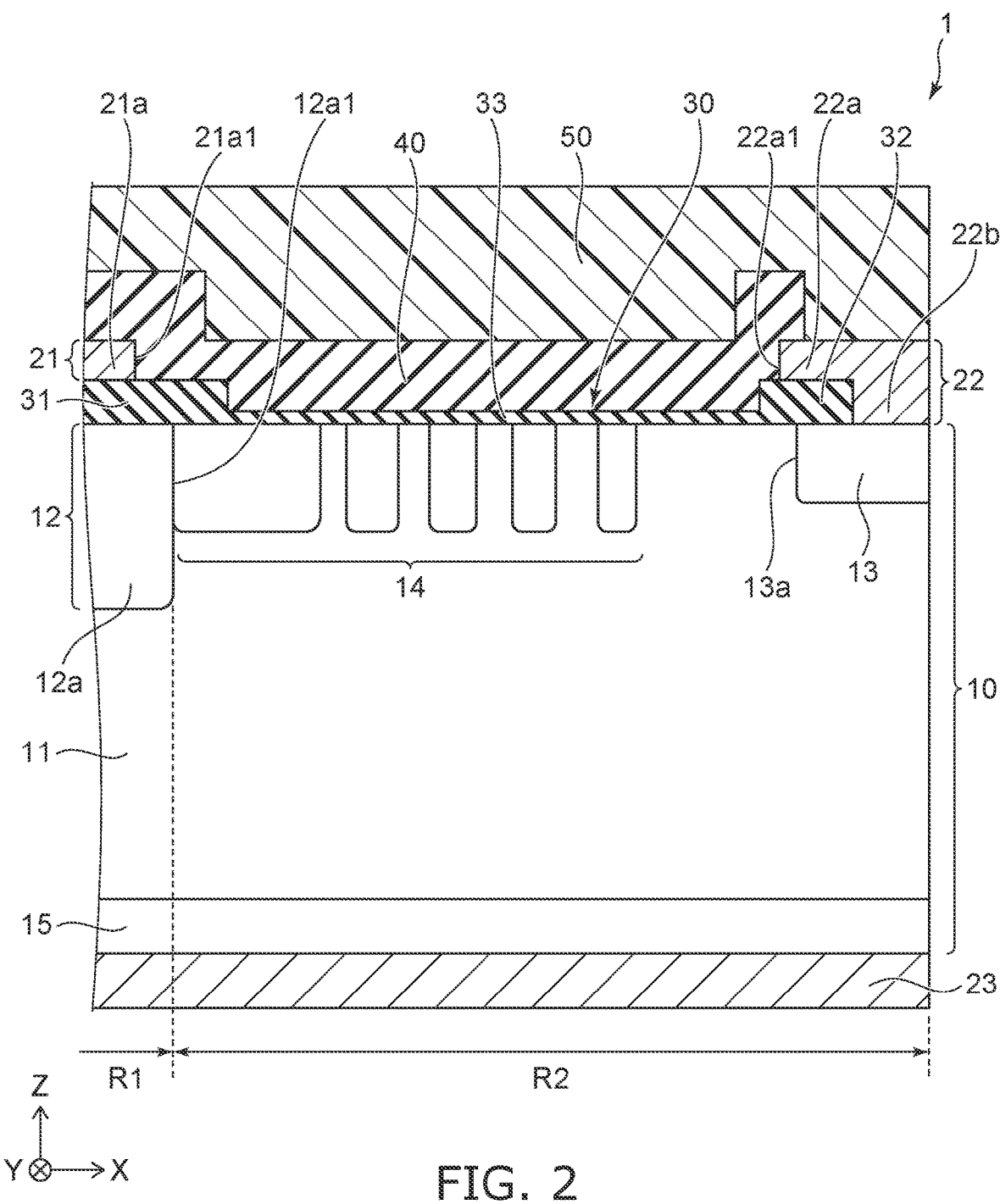
FIG. 2 is a schematic cross-sectional view along line A-A of FIG. 1.

As shown in FIG. 2, a semiconductor device 1 of an embodiment includes a semiconductor layer 10. The direction connecting one surface (in FIG. 2, the upper surface) and another surface (in FIG. 2, the lower surface) of the semiconductor layer 10 with the shortest distance is taken as a first direction Z. Two directions orthogonal to the first direction Z are taken as a second direction X and a third direction Y. The second direction X and the third direction Y are orthogonal to each other. FIG. 2 shows a cross section parallel to the first direction Z and second direction X plane.

According to embodiments described below, the semiconductor layer 10 is described as a silicon layer. The semiconductor layer 10 may be a silicon carbide layer or a gallium nitride layer.

The semiconductor layer 10 includes an element region R1 and a termination region R2. As shown in FIG. 1, the element region R1 is positioned inward of the termination region R2. The termination region R2 continuously surrounds the element region R1.

The semiconductor layer 10 includes an n-type first semiconductor part 11, a p-type second semiconductor part 12, and an n-type third semiconductor part 13. The first semiconductor part 11 is located in the element region R1 and the termination region R2. The second semiconductor part 12 is positioned on the first semiconductor part 11 in the element region R1. The third semiconductor part 13 is positioned on the first semiconductor part 11 in the termination region R2. The n-type impurity concentration of the third semiconductor part 13 is greater than the n-type impurity concentration of the first semiconductor part 11. The third semiconductor part 13 is next to the termination (or the outermost side surface) of the semiconductor layer 10. The third semiconductor part 13 is positioned distant to the second semiconductor part 12 in the second and third directions X and Y and is provided in a ring shape along the outer edge of the semiconductor device 1. In the specification, for example, an outer edge 12a1 of the second semiconductor part 12 is taken to be the boundary between the element region R1 and the termination region R2.

The semiconductor device 1 further includes a first electrode 21, a second electrode 22, an insulating film 30, a semi-insulating film 40, and a protective film 50. The first electrode 21, the second electrode 22, the insulating film 30, the semi-insulating film 40, and the protective film 50 are located at one surface side of the semiconductor layer 10.

The first electrode 21 is located on the second semiconductor part 12. A portion of the first electrode 21 contacts the second semiconductor part 12 in the element region R1; and the first electrode 21 is electrically connected with the second semiconductor part 12. FIG. 2 shows an end portion 21a of the first electrode 21 positioned at the termination region R2 side. For example, an outer edge 21a1 of the end portion 21a of the first electrode 21 is positioned more distant to the termination region R2 than the outer edge 12a1 of the second semiconductor part 12.

The second electrode 22 is located on the third semiconductor part 13 in the termination region R2. The second electrode 22 includes an inner perimeter portion 22a and an outer perimeter portion 22b. The inner perimeter portion 22a is positioned inward of the outer perimeter portion 22b in the second and third directions X and Y. The outer perimeter portion 22b contacts the third semiconductor part 13; and the second electrode 22 is electrically connected with the third semiconductor part 13. For example, an inner edge 22a1 of the inner perimeter portion 22a is positioned more proximate to the element region R1 than an inner edge 13a of the third semiconductor part 13. When operating the semiconductor device 1, a higher potential than that of the first electrode 21 is applied to the second electrode 22.

The semi-insulating film 40 is located on the termination region R2 of the semiconductor layer 10. A portion of the semi-insulating film 40 also is located on the element region R1 and contacts the end portion 21a of the first electrode 21. The end portion of the termination side of the semi-insulating film 40 contacts the inner perimeter portion 22a of the second electrode 22. As shown in FIG. 1, the semi-insulating film 40 is provided in a ring shape. The resistivity of the semi-insulating film 40 is greater than the resistivity of the semiconductor layer 10 and less than the resistivity of the insulating film 30.

The insulating film 30 is located between the semiconductor layer 10 and the semi-insulating film 40 in the first direction Z. The insulating film 30 contacts the semiconductor layer 10 and the semi-insulating film 40. Similarly to the semi-insulating film 40, the insulating film 30 is provided in a ring shape. The insulating film 30 is, for example, a silicon oxide film. Or, a silicon nitride film may be used as the insulating film 30. The insulating film 30 includes an inner perimeter portion 31, an outer perimeter portion 32, and an intermediate portion 33.

The inner perimeter portion 31 is located between the end portion 21a of the first electrode 21 positioned at the termination region R2 side and an end portion 12a of the second semiconductor part 12 positioned at the termination region R2 side.

The outer perimeter portion 32 is located between the semiconductor layer 10 and the inner perimeter portion 22a of the second electrode 22. In the example shown in FIG. 2, the outer perimeter portion 32 is located on a portion of the third semiconductor part 13 and on a portion of the first semiconductor part 11 next to the third semiconductor part 13.

The intermediate portion 33 is located between the inner perimeter portion 31 and the outer perimeter portion 32. The intermediate portion 33 is continuous with the inner perimeter portion 31 and the outer perimeter portion 32 in the second and third directions X and Y. The intermediate portion 33 is not located on the second semiconductor part 12 or on the third semiconductor part 13. The width in the second direction X of the intermediate portion 33 is greater than the width in the second direction X of the inner perimeter portion 31 and the width in the second direction X of the outer perimeter portion 32. The width in the third direction Y of the intermediate portion 33 is greater than the width in the third direction Y of the inner perimeter portion 31 and the width in the third direction Y of the outer perimeter portion 32. The thickness in the first direction Z of the intermediate portion 33 is less than the thickness in the first direction Z of the inner perimeter portion 31 and the thickness in the first direction Z of the outer perimeter portion 32.

The protective film 50 is an insulating film located on the semi-insulating film 40. The protective film 50 covers the semi-insulating film 40 and the second electrode 22. The protective film 50 is, for example, a resin film. For example, polyimide can be used as the material of the resin film.

The semiconductor device 1 can further include a third electrode 23. The third electrode 23 is located at another surface of the semiconductor layer 10 at the side opposite to the one surface at which the first electrode 21 and the second electrode 22 are located. The third electrode 23 is provided continuously in the element region R1 and the termination region R2. The second electrode 22 and the third electrode 23 are electrically connected. A major current flows between the third electrode 23 and the first electrode 21 in the element region R1 when operating the semiconductor device 1.

The semiconductor device 1 of the embodiment includes, for example, an IGBT (Insulated Gate Bipolar Transistor), a MOSFET (Metal-Oxide-Semiconductor Field Effect Transistor), or a diode in the element region R1.

The resistivity of the semi-insulating film 40 contacting the first and second electrodes 21 and 22 is not low enough to cause a short-circuit of the first and second electrodes 21 and 22 when operating the semiconductor device 1. In other words, when operating the semiconductor device 1, a current that is large enough to affect the operation of the semiconductor device 1 does not flow via the semi-insulating film 40 from the second electrode 22 to the first electrode 21 that has a lower potential than the second electrode 22. On the other hand, when a high electric field is applied to the termination region R2 from outside the protective film 50, electrons can flow to the second electrode 22 via the semi-insulating film 40; and electrons do not accumulate easily in the semi-insulating film 40. Accordingly, the electric field distribution of the termination region R2 of the semiconductor layer 10 does not change easily, and the breakdown voltage does not fluctuate easily. For example, such a semi-insulating film 40 includes silicon and nitrogen; and it is favorable for the nitrogen composition ratio in the semi-insulating film 40 to be not less than 40% and not more than 55%.

When the semi-insulating film 40 directly contacts the semiconductor layer 10, electrons move from the semiconductor layer 10 to the semi-insulating film 40 due to the potential difference between the semiconductor layer 10 and the semi-insulating film 40, making it easier for many electrons to be trapped in the semi-insulating film 40. Accordingly, the electric field distribution of the termination region R2 of the semiconductor layer 10 changes, and the breakdown voltage fluctuates.

According to the embodiment, the insulating film 30 is located between the semi-insulating film 40 and the termination region R2 of the semiconductor layer 10. The semi-insulating film 40 does not contact the semiconductor layer 10. Due to the potential difference between the semiconductor layer 10 and the semi-insulating film 40, electrons can tunnel through the insulating film 30 from the semiconductor layer 10 and can move to the semi-insulating film 40. By providing the insulating film 30 between the semiconductor layer 10 and the semi-insulating film 40, fewer electrons can be trapped in the semi-insulating film 40 than in a configuration in which the semi-insulating film 40 contacts the semiconductor layer 10. Accordingly, the electric field distribution of the termination region R2 of the semiconductor layer 10 does not change easily, and the breakdown voltage does not fluctuate easily.

When the thickness of the insulating film 30 is thick, the probability of electrons tunneling through the insulating film 30 decreases, and holes are more easily trapped in the semi-insulating film 40 due to electrons flowing in the vicinity of the interface between the semiconductor layer 10 and the insulating film 30. When the holes trapped in the semi-insulating film 40 increase, the electric field distribution of the termination region R2 of the semiconductor layer 10 changes, and the breakdown voltage fluctuates.

Accordingly, according to the embodiment, a thin intermediate portion 33 that allows some amount of electrons to tunnel from the semiconductor layer 10 is located between the semiconductor layer 10 and the semi-insulating film 40. Accordingly, neither electrons nor holes are excessively trapped in the semi-insulating film 40; and the electric field distribution of the termination region R2 of the semiconductor layer 10 does not change easily.

It is desirable for the inner perimeter portion 31 of the insulating film 30 between the end portion 21a of the first electrode 21 positioned at the termination region R2 side and the end portion 12a of the second semiconductor part 12 positioned at the termination region R2 side to have a prescribed thickness to ensure the insulation between the first electrode 21 and the semiconductor layer 10. For example, the thickness of the inner perimeter portion 31 can be 600 nm.

The inner perimeter portion 22a of the second electrode 22 applies an electric field to the semiconductor layer 10 via the insulating film 30. Accordingly, the depletion layer that extends from the p-n junction between the second semiconductor part 12 and the first semiconductor part 11 and the p-n junction between a fourth semiconductor part 14 and the first semiconductor part 11 can reach the third semiconductor part 13 while suppressing the spreading to be not less than the spreading of the depletion layer inside the first semiconductor part 11 so that the termination (the outermost side surface) of the semiconductor layer 10 is not reached. It is desirable for the thickness of the insulating film 30 between the second electrode 22 and the semiconductor layer 10 to be thick enough to appropriately control the depletion layer due to the electric field from such a second electrode 22. For example, the thickness of the outer perimeter portion 32 of the insulating film 30 between the second electrode 22 and the semiconductor layer 10 can be 600 nm.

The breakdown voltage of the semiconductor device 1 can be increased as the thickness in the first direction Z of the semiconductor layer 10 is increased. Also, the breakdown voltage of the semiconductor device 1 can be increased as the termination length is increased. The termination length is the length in the second direction X or the length in the third direction Y of the termination region R2. According to the embodiment, the thickness of the semiconductor layer 10 is, for example, not less than 450 μm and not more than 650 μm. The termination length is, for example, not less than 1.3 mm and not more than 2.1 mm. In such a configuration, to make it difficult for the electric field distribution of the termination region R2 to change, the thickness of the intermediate portion 33 can be not less than 1/1200 and not more than 1/300 of the thickness of the inner perimeter portion 31 and not less than 1/1200 and not more than 1/300 of the thickness of the outer perimeter portion 32. For example, the thickness of the intermediate portion 33 can be not less than 0.5 nm and not more than 2 nm.

The semiconductor layer 10 can further include the fourth semiconductor part 14. The fourth semiconductor part 14 is located between the first semiconductor part 11 and the insulating film 30 in the termination region R2. The intermediate portion 33 of the insulating film 30 is located between the fourth semiconductor part 14 and the semi-insulating film 40. The fourth semiconductor part 14 is of the p-type; and the p-type impurity concentration of the fourth semiconductor part 14 is less than the p-type impurity concentration of the second semiconductor part 12. For example, multiple fourth semiconductor parts 14 are provided in ring shapes. The fourth semiconductor part 14 is positioned between the second semiconductor part 12 and the third semiconductor part 13 in the second and third directions X and Y. By providing the fourth semiconductor part 14 in the termination region R2, the depletion layer extends more easily from the p-n junction between the fourth semiconductor part 14 and the first semiconductor part 11 toward the termination; and the breakdown voltage of the semiconductor device 1 can be increased.

Electrons (a leakage current) are easily generated at the p-n junction between the fourth semiconductor part 14 and the first semiconductor part 11. Therefore, a configuration in which a thin intermediate portion 33 of the insulating film 30 is located between the semi-insulating film 40 and the region of the semiconductor layer 10 in which the fourth semiconductor part 14 is located is effective for making it difficult for the electric field distribution of the termination region R2 to change.

The semiconductor layer 10 can further include a fifth semiconductor part 15. The fifth semiconductor part 15 is located between the first semiconductor part 11 and the third electrode 23 in the first direction Z and contacts the third electrode 23. In a MOSFET, the fifth semiconductor part 15 is of the n-type; and the n-type impurity concentration of the fifth semiconductor part 15 is greater than the n-type impurity concentration of the first semiconductor part 11. In an IGBT, the fifth semiconductor part 15 is of the p-type; and the p-type impurity concentration of the fifth semiconductor part 15 is greater than the p-type impurity concentration of the second semiconductor part 12. Also, in an IGBT, a sixth semiconductor part of the n-type may be provided between the first semiconductor part 11 and the fifth semiconductor part 15. The n-type impurity concentration of the sixth semiconductor part is greater than the n-type impurity concentration of the first semiconductor part 11.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a semiconductor layer including an element region, and a termination region surrounding the element region, the semiconductor layer including
      a first semiconductor part of a first conductivity type,
      a second semiconductor part positioned on the first semiconductor part in the element region, the second semiconductor part being of a second conductivity type, and
      a third semiconductor part positioned on the first semiconductor part in the termination region, the third semiconductor part being of the first conductivity type and having a higher impurity concentration than the first semiconductor part;
   a first electrode located on the second semiconductor part, the first electrode being electrically connected with the second semiconductor part;
   a second electrode located on the third semiconductor part, the second electrode being electrically connected with the third semiconductor part;
   a semi-insulating film located on the termination region of the semiconductor layer, the semi-insulating film contacting the first and second electrodes;
   an insulating film located between the semiconductor layer and the semi-insulating film; and a protective film located on the semi-insulating film, the protective film being insulative, the insulating film including
- an inner perimeter portion, the inner perimeter portion being located between an end portion of the first electrode positioned at the termination region side and an end portion of the second semiconductor part positioned at the termination region side,
- an outer perimeter portion located between the second electrode and the semiconductor layer, and
- an intermediate portion located between the inner perimeter portion and the outer perimeter portion, a thickness of the intermediate portion being less than a thickness of the inner perimeter portion and a thickness of the outer perimeter portion.

2. The device according to claim 1, wherein
the thickness of the intermediate portion is not less than $1/1200$ and not more than $1/300$ of the thickness of the inner perimeter portion and not less than $1/1200$ and not more than $1/300$ of the thickness of the outer perimeter portion.

3. The device according to claim 1, wherein
the thickness of the intermediate portion is not less than 0.5 nm and not more than 2 nm.

4. The device according to claim 1, wherein
the semi-insulating film includes silicon and nitrogen, and a composition ratio of nitrogen in the semi-insulating film is not less than 40% and not more than 55%.

5. The device according to claim 1, wherein
the semiconductor layer is a silicon layer, and
the insulating film is a silicon oxide film.

6. The device according to claim 1, wherein
the semiconductor layer further includes a fourth semiconductor part located between the first semiconductor part and the insulating film in the termination region,
the fourth semiconductor part is of the second conductivity type, and
an impurity concentration of the fourth semiconductor part is less than an impurity concentration of the second semiconductor part.

7. The device according to claim 1, further comprising:
a third electrode,
the semiconductor layer further including a fifth semiconductor part located between the first semiconductor part and the third electrode,
the fifth semiconductor part having a higher impurity concentration than the first semiconductor part.

8. The device according to claim 1, wherein
the third semiconductor part is provided in a ring shape along an outer edge of the device.

9. The device according to claim 1, wherein
an outer edge of the end portion of the first electrode is positioned more distant to the termination region than an outer edge of the end portion of the second semiconductor part.

10. The device according to claim 1, wherein
an inner edge of the second electrode positioned on the insulating film is positioned more proximate to the element region than an inner edge of the third semiconductor part.

11. The device according to claim 1, wherein
the semi-insulating film is provided in a ring shape.

12. The device according to claim 1, wherein
a resistivity of the semi-insulating film is greater than a resistivity of the semiconductor layer and less than a resistivity of the insulating film.

13. The device according to claim 1, wherein
the outer perimeter portion of the insulating film is positioned between the second electrode and the third semiconductor part.

14. The device according to claim 1, wherein
the intermediate portion of the insulating film is not located on the second semiconductor part or on the third semiconductor part.

15. The device according to claim 1, wherein
the protective film is a resin film.

16. The device according to claim 1, wherein
an IGBT (Insulated Gate Bipolar Transistor), a MOSFET (Metal-Oxide-Semiconductor Field Effect Transistor), or a diode is included in the element region.

17. The device according to claim 1, wherein
the semi-insulating film does not contact the semiconductor layer.

18. The device according to claim 7, wherein
the first semiconductor part and the fifth semiconductor part are of an n-type, and
an n-type impurity concentration of the fifth semiconductor part is greater than an n-type impurity concentration of the first semiconductor part.

19. The device according to claim 7, wherein
the second semiconductor part and the fifth semiconductor part are of a p-type, and
a p-type impurity concentration of the fifth semiconductor part is greater than a p-type impurity concentration of the second semiconductor part.

20. The device according to claim 19, wherein
the semiconductor layer further includes a sixth semiconductor part located between the first semiconductor part and the fifth semiconductor part,
the sixth semiconductor part is of the n-type, and
an n-type impurity concentration of the sixth semiconductor part is greater than an n-type impurity concentration of the first semiconductor part.

* * * * *